United States Patent
Hattori et al.

(10) Patent No.: US 10,388,353 B1
(45) Date of Patent: Aug. 20, 2019

(54) CANCELING MEMORY CELL VARIATIONS BY ISOLATING DIGIT LINES

(71) Applicant: Micron Technology, Inc., Boise, ID (US)

(72) Inventors: Yasuko Hattori, Folsom, CA (US); Mahdi Jamali, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/923,700

(22) Filed: Mar. 16, 2018

(51) Int. Cl.
*G11C 11/22* (2006.01)
*H01L 27/11514* (2017.01)
*G11C 11/56* (2006.01)

(52) U.S. Cl.
CPC ........ *G11C 11/2273* (2013.01); *G11C 11/221* (2013.01); *H01L 27/11514* (2013.01); *G11C 11/2255* (2013.01); *G11C 11/2257* (2013.01); *G11C 11/2275* (2013.01); *G11C 11/5657* (2013.01)

(58) Field of Classification Search
CPC .............. G11C 11/2273; G11C 11/221; G11C 11/2255; G11C 11/5657; G11C 11/2257; G11C 11/2275; H01L 27/11514
See application file for complete search history.

(56) References Cited

U.S. PATENT DOCUMENTS

| | | | |
|---|---|---|---|
| 2015/0016175 A1* | 1/2015 | Evans, Jr. | G11C 11/221 365/145 |
| 2017/0287541 A1* | 10/2017 | Vimercati | G11C 11/221 |
| 2018/0061470 A1* | 3/2018 | Di Vincenzo | G11C 11/221 |

* cited by examiner

*Primary Examiner* — Jerome Leboeuf
(74) *Attorney, Agent, or Firm* — Holland & Hart LLP

(57) ABSTRACT

A memory device may include a digit line, a ferroelectric memory cell coupled with the digit line, a first capacitor including a first node and a second node, the first node coupled with the digit line using a first path and the second node coupled with the digit line using a second path different from the first path, and a switching component positioned in the second path and coupled with the second node of the first capacitor and the digit line. The switching component may selectively couple the second node of the first capacitor with the digit line. In some cases, the memory device may also include a second capacitor coupled with the digit line and the second node of the first capacitor.

13 Claims, 11 Drawing Sheets

CANCELING MEMORY CELL VARIATIONS BY ISOLATING DIGIT LINES

BACKGROUND

The following relates generally to a memory device and more specifically to techniques and devices for canceling memory cell variations.

Memory devices are widely used to store information in various electronic devices such as computers, cameras, digital displays, and the like. Information is stored by programming different states of a memory device. For example, binary devices have two states, often denoted by a logic '1' or a logic '0.' In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include reducing cell variations thereby increasing memory cell density, increasing read/write speeds, increasing reliability, increasing data retention, reducing power consumption, or reducing manufacturing costs, among other metrics.

DETAILED DESCRIPTION

Figure 1:
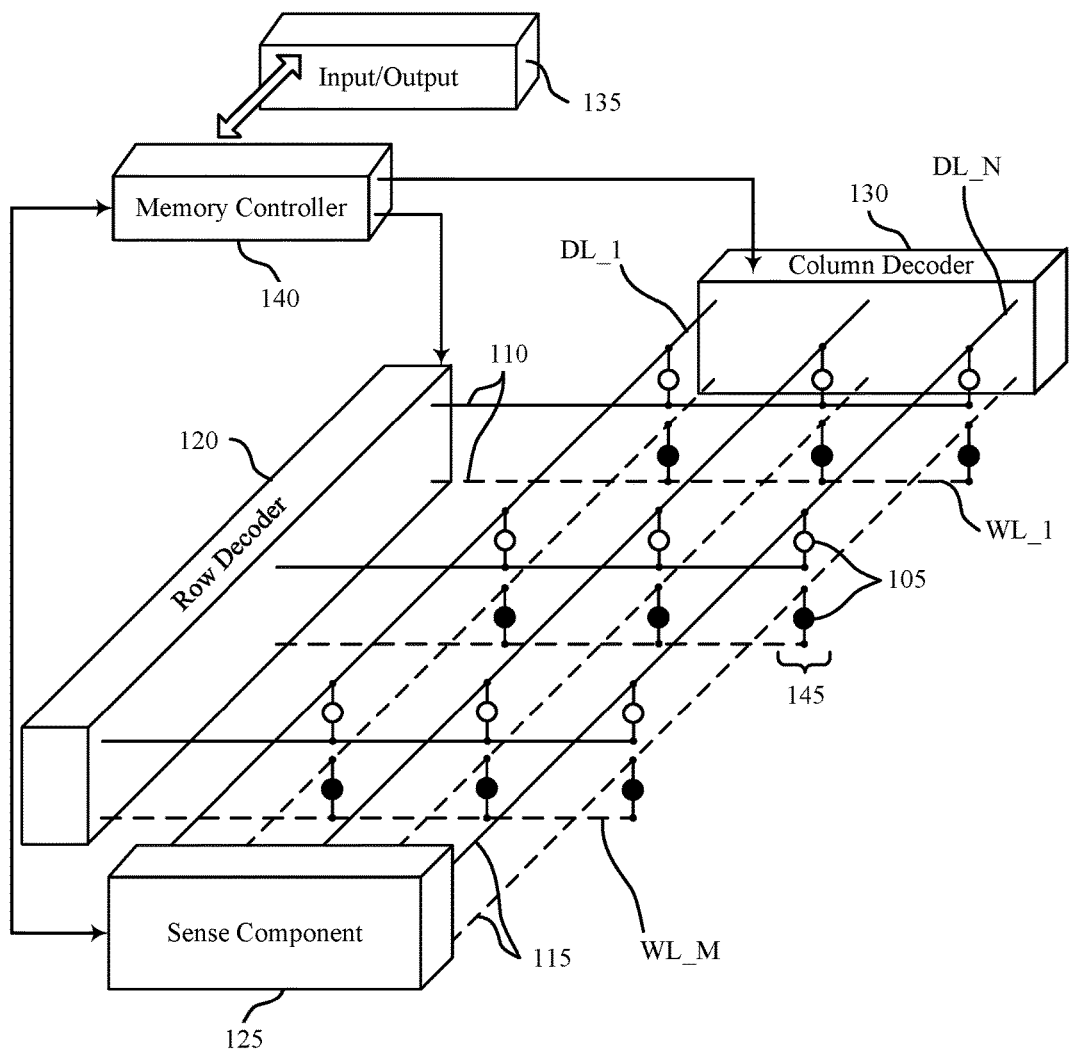
FIG. 1 illustrates an example of a memory array that supports techniques and devices for canceling memory cell variations in accordance with embodiments of the present disclosure.

Ferroelectric memory cells may include a capacitor that stores a logic state, either a logic '1' or a logic '0'. Reading the value of the memory cell, in some cases, involves coupling a digit line to the memory cell and transferring charge between the memory cell capacitor and the digit line. A sense component may determine the value of the memory cell based on the resulting voltage on the digit line.

In some systems, hysteresis characteristics of ferroelectric random-access memory (FeRAM) may be used to store values in a ferroelectric memory cell. Depending on a bias applied to the ferroelectric memory cell, the ferroelectric memory cell may be configured to store a charge logic state. During a read operation, a voltage (e.g., Vread) may be applied to the ferroelectric memory cell. Upon receiving the read voltage, the ferroelectric memory cell may be configured to sense a difference between the charge stored by the ferroelectric memory cell and a reference signal. Based on the difference, an output state may be detected. In some cases, a latch may be coupled with the Vout to facilitate identifying an output state of the ferroelectric memory cell.

As will be described in more detail herein, the sense component of some ferroelectric memory devices may include an amplifier capacitor that may configured to extract and amplify the charge stored by the ferroelectric memory cell during a read operation. More specifically, the amplifier capacitor may amplify a signal of the ferroelectric memory cell depending on a capacitance level of the amplifier capacitor. In some examples, a Vout signal (or signals) corresponding to state '1' or state '0' may be amplified by the amplifier capacitor. Over time, the characteristics of different ferroelectric memory cells in a memory array may shift and may cause variations in performance between different memory cells of the same array. In some cases, the variations in memory cell characteristics and/or performance may result from cell usage (e.g., a number of access operations performed using the memory cell), temperature, processes, or any combination thereof.

These cell variations may introduce errors into the data stored in the memory array. In some cases, variations in cell performance may cause the charge stored on the capacitor for a particular logic state to drift. For example, some ferroelectric memory cells may have signal identifying logic '1' at a voltage level that is lower than a voltage level identifying logic '1' for some other ferroelectric memory cells. In some cases, a single fixed reference signal may be used to identify an output state for multiple ferroelectric memory cells. Such reference signals may typically be set at voltage level that is between a charge associated with a logic '1' and a charge associated with a logic '0'.

When the reference signal is fixed, however, variations of the charges stored on memory cells may cause the sense window to shrink for certain logic states. As the sense window shrinks, the likelihood of reading an error in the memory cell increases. Across an entire memory array, errors may be compounded by each cell having its own unique variations. Therefore, in some cases, it may be difficult to maintain the performance of a memory array over time using a fixed reference signal for multiple ferroelectric memory cells. In some cases, some self-referencing read operations may be used to mitigate some of these challenges, but self-referencing schemes may also have drawbacks or may be less effective in some circumstances.

Techniques, systems, and devices are described herein for compensating for variations in cell performance in a read operation that uses a static reference signal. This may be achieved by using unused charge during the read operation to cancel variations in cell performance before the voltage output by the memory cell is compared to a reference signal. As an example, during a first portion of the read operation, the ferroelectric memory cell may be coupled with a first node of an amplifier capacitor and may transfer its charge to the amplifier capacitor. During a second portion of the read operation, the memory cell may be isolated from the digit line temporarily and may be coupled with a second node of the amplifier capacitor to cancel out cell-specific variations in the charge on the amplifier capacitor. Such a read operation may homogenize the output voltage of a plurality of memory cells to more consistent values and thereby reduce the likelihood of errors during a read operation that uses a fixed reference signal for multiple memory cells.

The present techniques may improve the state of the conventional system may collect the charge lost during the second portion of the read operation and may utilize the charge as a reference signal for the ferroelectric memory cell.

Features of the disclosure introduced above are further described below in the context of FIGS. 1 through 3. Specific examples and benefits are then described with respect to FIGS. 4 through 10. These and other features of the disclosure are further illustrated by and described with reference to apparatus diagrams, system diagrams, and flow-charts that relate to techniques and devices for canceling memory cell variations.

FIG. 1 illustrates an example memory array 100 in accordance with various embodiments of the present disclosure. FIG. 1 is an illustrative schematic representation of various components and features of the memory array 100. As such, it should be appreciated that the components and feature of the memory array 100 are shown to illustrate functional interrelationships, not their actual physical positions within the memory array 100. Memory array 100 may also be referred to as an electronic memory apparatus. Memory array 100 includes memory cells 105 that are programmable to store different states. In some cases, each memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic '0' and a logic '1'. Each memory cell 105 may be stacked on top of each other resulting in two decks of memory cell 145. Hence, the example in FIG. 1 may be an example that depicts two decks of memory array.

In some cases, memory cells 105 are configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, and access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM), other access lines may be present (not shown), such as plate lines, for example. It should be appreciated that the exact operation of the memory device may be altered based on the type of memory cell and/or the specific access lines used in the memory device.

Activating, asserting, or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

Memory array 100 may be a two-dimensional (2D) memory array or a three-dimensional (3D) memory array. A 3D memory array may include 2D memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. Each row of memory cells 105 may be connected to a single word line 110, and each column of memory cells 105 may be connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, a charge of a ferroelectric memory cell may be transferred to a first capacitor (such as AMP-CAP) during a first portion of a read operation, and the ferroelectric memory cell may be isolated from the digit line associated with the ferroelectric memory cell based on transferring the charge. During a second portion of the read operation, the digit line 115 may then be coupled with a second node of the first capacitor to cancel out cell-specific variations in the charge on the first capacitor.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In addition, an access operation of ferroelectric memory cells may need to activate a corresponding plate line for the memory cell 105, associated with plate line decoder (not shown).

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) to determine the stored state of the memory cell 105. For example, if digit line 115 (or it's amplified voltage in the sense component 125) has a higher voltage than the reference voltage, then sense component 125 may determine that the stored state in memory cell 105 was a logic '1' and vice versa. Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

In some embodiments, the sense component 125 may include a capacitor configured to be precharged to a known voltage level. This capacitor may be referred to as an amplifier capacitor. The amplifier capacitor (or AMPCAP) may be connected to a selected digit line 115 to raise the voltage of the digit line 115 to an initial sensing value, and may subsequently be coupled to a memory cell 105 to exchange an amount of charge with the memory cell 105. The additional amount of charge may correspond to a logic state of the memory cell 105 (e.g., a logic state of 1 or 0). Thus, the amplifier capacitor may be used to detect a signal from the memory cell 105 during the read operation. In some cases, during a read operation, the amplifier capacitor may initially be coupled to the selected digit line 115 to raise the voltage of digit line 115 to an initial sensing voltage, then decoupled (isolated) from the digit line 115 for a portion of the read operation as the ferroelectric capacitor of the memory cell absorbs charge from the digit line 115 and the signal on the digit line 115 develops, then recoupled to the digit line 115 to transfer additional charge to the memory cell 105 and detect a value of the memory cell 105.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and digit line 115. Memory controller 140 may also generate and control various voltages or currents used during the operation of memory array 100.

In some embodiments, the memory controller 140 may control various phases of a read operation. In some cases, the memory controller 140 may control various timings associated with precharging an amplifier capacitor that is configured to detect a logic state of the memory cell 105, such as coupling the amplifier capacitor with a voltage supply node to precharge the amplifier capacitor, coupling or decoupling the precharged amplifier capacitor to the selected digit line. In some cases, the memory controller 140 may control various timings associated with activating or deactivating a transistor configured to couple or uncouple the amplifier capacitor with the digit line.

In general, the amplitude, shape, or duration of an applied voltage or current discussed herein may be adjusted or varied and may be different for the various operations discussed in operating the memory array 100. Furthermore, one, multiple, or all memory cells 105 within the memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present (not shown), a corresponding plate line that is connected with a word line and a digit line may need to be activated to access a certain memory cell 105 of the memory array. It should be appreciated that the exact operation of the memory device may vary based on the type of memory cell and/or the specific access lines used in the memory device.

Figure 2:
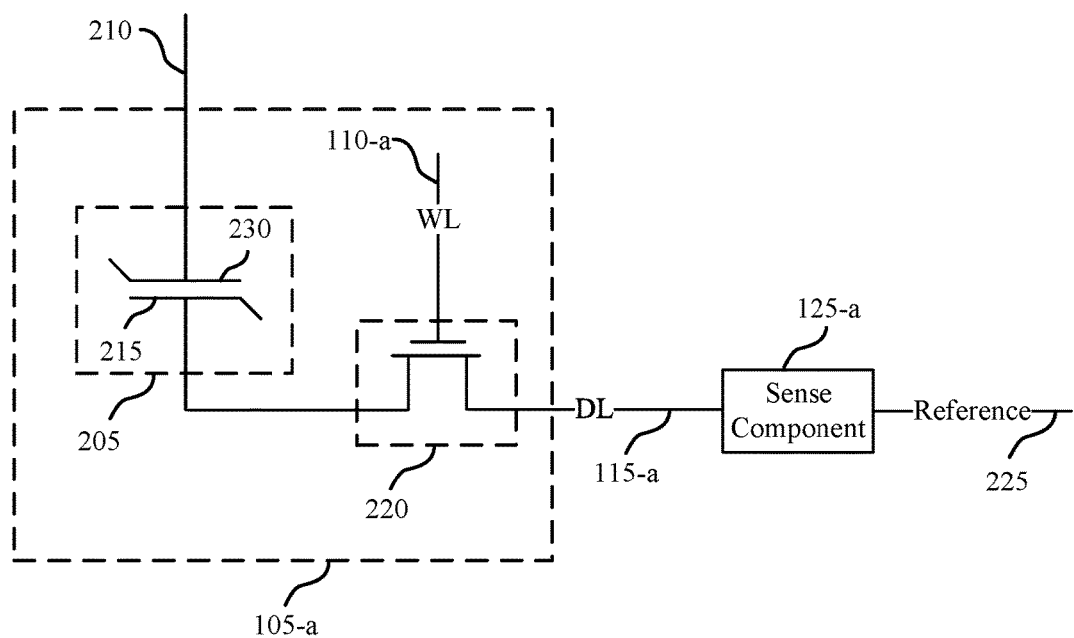
FIG. 2 illustrates an example of a circuit that supports techniques and devices for canceling memory cell variations in accordance with embodiments of the present disclosure.

FIG. 2 illustrates a circuit 200 of a ferroelectric memory cell and circuit components that supports techniques and devices for canceling memory cell variations accordance with embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selector device 220 and reference line 225. Cell plate 230 may be accessed via plate line 210 and cell bottom 215 may be accessed via digit line 115-a. As described above, various states may be stored by charging or discharging the capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selector device 220 is deactivated, and capacitor 205 can be connected to digit line 115-a when selector device 220 is activated. Activating selector device 220 may be referred to as selecting memory cell 105-a. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-a may activate the selector device 220; for example, a voltage applied to word line 110-a is applied to the transistor gate, connecting the capacitor 205 with digit line 115-a.

In other examples, the positions of selector device 220 and capacitor 205 may be switched, such that selector device 220 is connected between plate line 210 and cell plate 230 and such that capacitor 205 is between digit line 115-a and the other terminal of selector device 220. In this embodiment, selector device 220 may remain in electronic communication with digit line 115-a through capacitor 205. This configuration may be associated with alternative timing and biasing for read and write operations.

Due to the ferroelectric material between the plates of ferroelectric capacitor 205, and as discussed in more detail below, ferroelectric capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across ferroelectric capacitor 205. The voltage difference may yield a change in the stored charge on ferroelectric capacitor 205, where the magnitude of the change in stored charge may depend on the initial state of ferroelectric capacitor 205—e.g., whether the initial state stored a logic '1' or a logic '0.' This may cause a change in the voltage of digit line 115-a based on the charge stored on ferroelectric capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage may depend on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be set to a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage.

In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic '1.' Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic '0.' The latched logic state of memory cell 105-a may then be output, for example, through column decoder 130 as output 135 with reference to FIG. 1.

In some embodiments, during a read operation, a charge of a memory cell 105-a may be transferred to an amplifier capacitor using a first node of the amplifier capacitor. After a precharge operation of a memory cell 105-a, the memory cell 105-a may be isolated from the digit line 115-a. After the isolation of the digit line 115-a, a second node of the amplifier capacitor may be coupled with the digit line 115-a to cancel out cell-specific variations in the charge stored on the amplifier capacitor.

To write memory cell 105-a, a voltage may be applied across capacitor 205. Various methods may be used. In one example, selector device 220 may be activated through word line 110-a to electrically connect capacitor 205 to digit line 115-a. A voltage may be applied across capacitor 205 by controlling the voltage of cell plate 230 (through plate line 210) and cell bottom 215 (through digit line 115-a). To write a logic '0,' cell plate 230 may be taken high, that is, a positive voltage may be applied to plate line 210, and cell bottom 215 may be taken low, e.g., virtually grounding or applying a negative voltage to digit line 115-a. The opposite process is performed to write a logic '1,' where cell plate 230 is taken low and cell bottom 215 is taken high.

Figure 3:
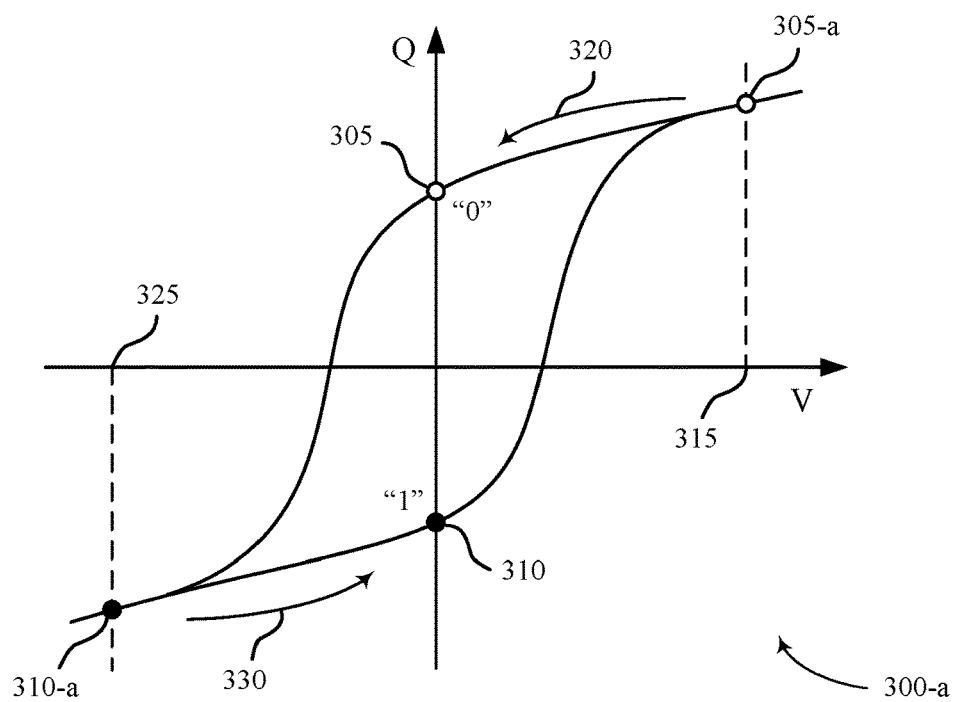
FIG. 3 illustrates an example of hysteresis curves that support techniques and devices for canceling memory cell variations in accordance with embodiments of the present disclosure.
Figure 3:
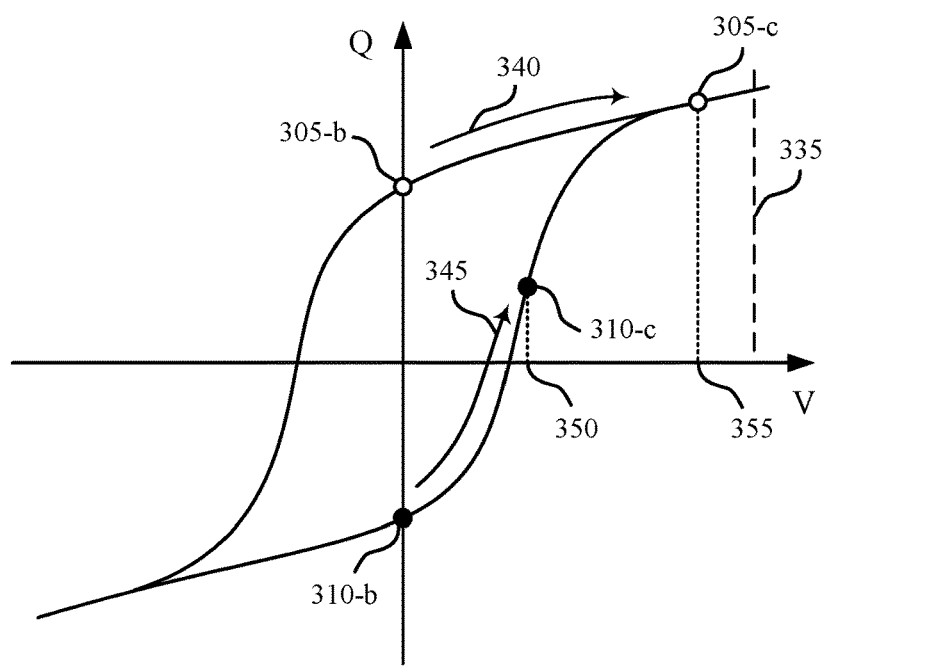

FIG. 3 illustrates an example of non-linear electrical properties with hysteresis curves 300-a and 300-b for a ferroelectric memory cell that supports techniques for reading a memory cell using multi-stage memory sensing in accordance with embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic '0' and charge state 310 represents a logic '1.' In some examples, the logic values of the respective charge states may be reversed to accommodate other schemes for operating a memory cell.

A logic '0' or '1' may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). The reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355).

Upon comparison by the sense component, the sensed digit line voltage may be determined to be higher or lower than the reference voltage, and the stored logic value of the ferroelectric memory cell (i.e., a logic '0' or '1') may be determined. In some examples, an amplifier capacitor (not shown) may be used during a read operation in a manner that amplifies the difference between the digit line voltage and the reference voltage to increase the accuracy of the read operation. In some examples, the amplifier capacitor may be coupled to the digit line to provide an initial sensing voltage to the digit line, then isolated from the digit line as the memory cell capacitor discharges onto the digit line, then recoupled to the digit line to help detect the value of the memory cell.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
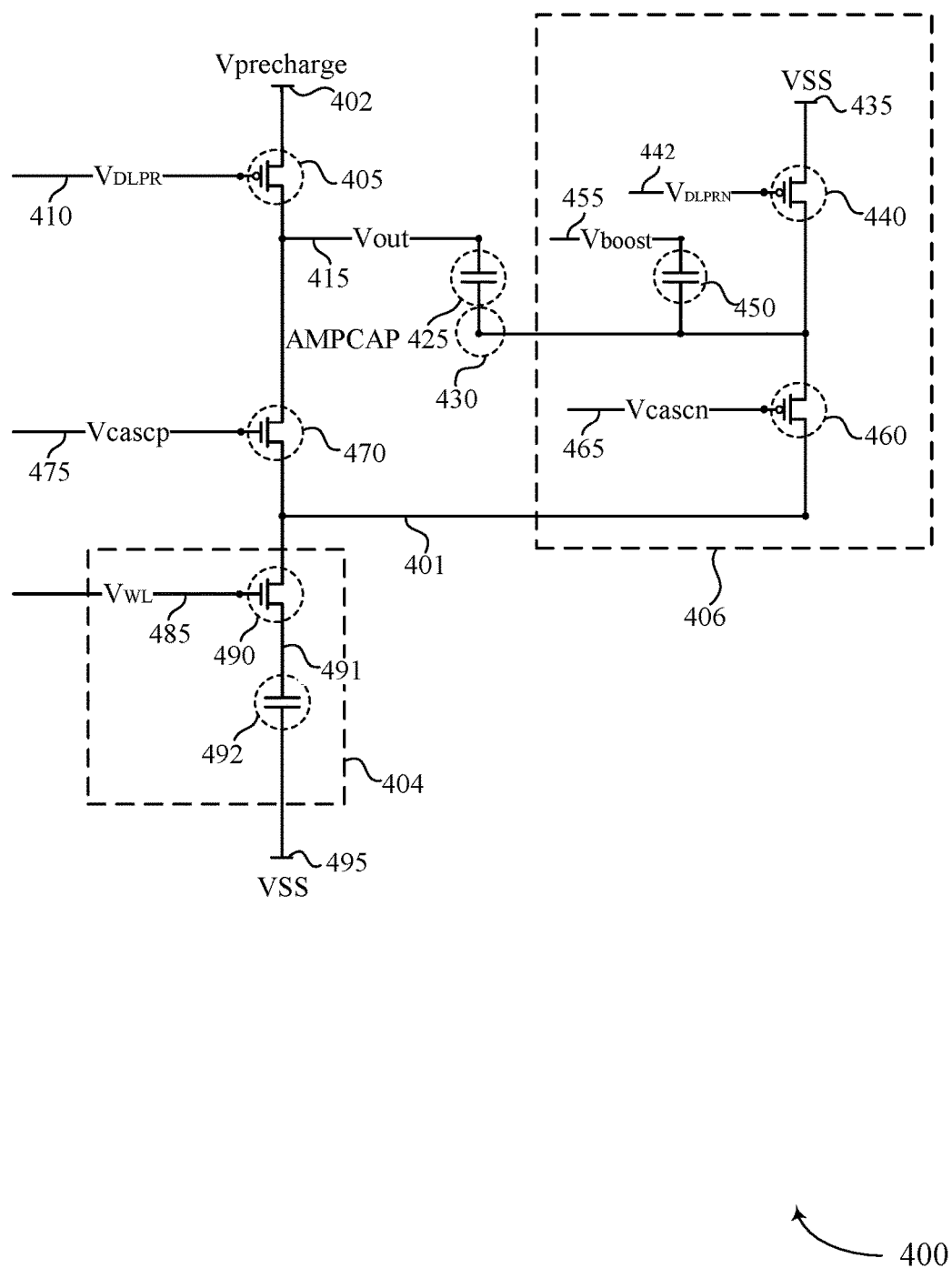
FIG. 4 illustrates an example of a circuit that supports techniques and devices for canceling memory cell variations in accordance with embodiments of the present disclosure.

FIG. 4 illustrates an example of a circuit 400 that supports techniques and devices for canceling memory cell variations in accordance with embodiments of the present disclosure. The circuit 400 illustrates a simplified circuit configuration to highlight several circuit components that work together to enable canceling of memory cell variations that provides a fast and reliable read operation.

The circuit 400 includes a digit line (DL) 401, a memory cell 404, and a cancelation circuit 406. The DL 401 may be an example of the digit line 115-b described with reference to FIG. 2. The memory cell 404 may be an example of the memory cell 105 described with reference to FIGS. 1 and 2. For example, the memory cell 404 may be a ferroelectric memory cell. The cancelation circuit 406 may be connected to a sense component (not shown). In some examples, the sense component may be an example of or some portion of the sense component 125 described with reference to FIGS. 1 and 2.

In some examples, the memory cell 404 may include a selector device 490 and a capacitor 492. In some cases, the capacitor 492 may be an example of a ferroelectric capacitor, such as capacitor 205 described with reference to FIG. 2. The selector device 490 may be an example of the selector device 220 described with reference to FIG. 2. In some cases, the selector device 490 may be an nmos transistor. In some examples, the memory cell 404 may be associated with a word line (WL) 485. The WL 485 may be an example of the word line 110 described with reference to FIGS. 1 and 2. In the example of FIG. 4, a voltage of the WL 485 may be determined at a terminal of the selector device 490. Additionally, a node of the capacitor 492 may be coupled with a ground 495.

In some examples, the capacitor 492 may store a logic state (e.g., a logic state of 1 or 0) after an access operation of the memory cell 404. In some implementations, during an access operation (e.g., a read operation or a write operation), the WL 485 may be asserted (e.g., selected). Further, during the read operation, the selector device 490 may couple the capacitor 492 with the DL 401.

In the example of FIG. 4, the memory cell 404 may be coupled with a second selector device 470. The second selector device 470 may be an nmos transistor configured to couple the memory cell 404 with a voltage source 402. The second selector device 470 may be coupled with a third selector device 405, which in turn is configured to couple a terminal of the second selector device 470 with the voltage source 402.

As depicted in the example of FIG. 4, a drain of the second selector device 470 may be coupled with a source of the third selector device 405. In one example, a voltage signal applied at a gate of the second selector device 470 may be referred to as the voltage Vcascp 475. In some cases, the voltage Vcascp 475 may be applied to the gate node of the selector device 470 that may activate the selector device 470 to couple the memory cell 404 with the voltage source 402. In some examples, a voltage signal applied at a gate of the third selector device 405 may be referred to as $V_{DLPR}$ 410. In some cases, the voltage $V_{DLPR}$ 410 may be applied to the gate node of the third selector device 405 that may activate the third selector device 405 to couple the memory cell 404 with the voltage source 402 (such as Vprecharge).

In some examples, the circuit 400 may further include an amplifier capacitor (AMPCAP) 425. In some embodiments, the AMPCAP 425 may be selectively couplable with a voltage source 402. The voltage source 402 in some examples, may supply voltage to precharge the AMPCAP 425 to a known voltage (e.g., a high voltage for a sense amplifier) before sensing the logic state stored on the memory cell 404 during a read operation. In the example of FIG. 4, the AMPCAP 425 may be precharged to a precharge level. The precharge level may be determined at a node of the AMPCAP 425. In some cases, a voltage at a node of the AMPCAP 425 may be referred as Vout. In some examples, during a period of precharge, a voltage level Vout may be higher than a voltage applied for a read operation (e.g., Vread).

Further, a voltage (Vread) may be applied to the memory cell 404 to perform a read operation. During a first time period of the read operation, the AMPCAP 425 may be coupled with the DL 401 to raise the voltage of the DL 401 to Vread. To do this, the second selector device 470 may be activated. Upon receiving a read voltage, the voltage level of the DL 401 may be set to Vread (i.e., the voltage applied during the read operation). In some examples, during the read operation, the WL 485 may be selected and the selector device 490 may thus be activated, thereby coupling the memory cell 404 with the DL 401. In some embodiments, activating both the second selector device 470 and the selector device 490 may couple the AMPCAP 425 with memory cell 404. In some embodiments, after activating the DL 401, a source side 491 of the selector device 490 may be charged to the same level as the DL 401. In some examples, a voltage at the source side 491 of the selector device 490 is referred to as $V_{CB}$. In some examples, the source side 491 of the selector device 490 may be charged to a voltage level equal to the voltage applied during a read operation (Vread).

Thus, upon application of a read voltage (such as Vread), a voltage stored by the AMPCAP 425 may change based on the charge stored on the memory cell 404. The output voltage at the node 415 of the AMPCAP 425 may be referred to as Vout. In this manner, the AMPCAP 425 may be used to determine a value of memory cell 404.

In some examples, the circuit 400 may include a cancelation circuit 406 to cancel out cell-specific variations in the Vout signal during a read operation. The cancelation circuit 406 may couple a second node 430 of the AMPCAP 425 to the DL 401 during a second time period of the read operation before the output signal is compared to a reference signal. By using cell-specific charge of the DL 401 and/or memory cell 404 during the second time period, the cancelation circuit 406 may be able to account for cell-specific variations in the charge stored on the AMPCAP 425 during the first time period. In such a manner, the cancelation circuit 406 may be configured to normalize (or homogenize) the output signal of a plurality of memory cells in a memory array before comparing those output signals to reference signals.

The cancelation circuit 406 may include a selector device 440, a second capacitor 450 (e.g., boost capacitor or Cboost), and selector device 460 that selectively couple the second node 430 of the AMPCAP 425 with the DL 401 and/or a voltage source 435 In some examples, a voltage signal applied at a gate of the selector device 440 may be referred to $V_{DLPRN}$ 442. In some cases, the voltage $V_{DLPRN}$ 442 may be applied to the gate node of the selector device 440 that may activate the selector device 440 to couple the boost capacitor 450 and the AMPCAP 425 with a ground 435.

In some examples, a first node of the second capacitor 450 may be coupled to a node of the AMPCAP 425. Further, in some cases, the second capacitor 450 may be coupled with the DL 401 using a selector device 460. The selector device 460 may be a pmos transistor. In some cases, the selector device 460 may be configured to isolate and recouple the DL 401 to the second capacitor 450 as well as to the AMPCAP 425. The first node of the second capacitor 450 may further be coupled with selector device 440. Selector device 440 may also be a pmos transistor. In some cases, the selector device 440 may be configured to couple the second capacitor 450 with a ground 435.

During a first time period of the read operation, the cancelation circuit 406 may be configured to apply a first voltage to the second node 430 and/or isolate the second node 430 from the DL 401. During the first time period, the second node 430 may be coupled with a voltage source 435 (e.g., $V_{SS}$ or ground) and the second capacitor 450. During the first time period, the voltage Vboost 455 may be applied thereby influencing the voltage level of the second node 430 during the first time period. To do this, the selector device 440 may activated such that it couples the second node 430 with the voltage source 435 (e.g., $V_{SS}$ or ground) and the selector device 460 may be deactivated to isolate the second node 430 from the DL 401.

After an initial period of the read operation. The DL 401 may be isolated from the memory cell 404. In some cases, the DL 401 may be isolated to secure charge for canceling cell variation. Under such circumstances, the DL 401 may be configured to discharge through the selector device 460. For example, the selector device 460 may be turned on to receive charge from the DL 401. In some examples, activating the selector device 460 may first include deactivating the selector device 470. The selector device 470 may be turned off by biasing the signal Vcascp and thereby opening the gate and the selector device 460 may be activated by applying a voltage Vcascn 465 to the gate of the selector device 460. In some cases, the voltage Vcascn 465 may be applied to the gate node of the selector device 460 that may activate the selector device 460 to couple the DL 401 with the boost capacitor 450 and the AMPCAP 425. In one example, a voltage at second node 430 (such as the voltage Vneg 555) of the AMPCAP 425 may be biased to a lower voltage level based on coupling the second node 430 to the DL 401. In the example of FIG. 4, the voltage at the second node 430 may be influenced by the voltage Vboost 455. For example, during the second time period, the voltage Vboost 455 may be reduced. More specifically, when the DL 401 discharges through the AMPCAP 425, a charge stored in the capacitor 45 may result in the voltage at the second node 430 to decrease.

In some examples, a voltage applied to the capacitor 450 may be controlled by the circuit 400. The signal received from the DL 401 and/or memory cell 404 during the second time period may cause the voltage stored on the capacitor 450 to change or be reduced. The charge stored on the second capacitor 450 may cooperate with the charge received from the DL 401 and/or the memory cell 404 to cancel out cell-specific variations in the charge stored on the AMPCAP 425 during the first period of the read operation. Thus, the cancelation circuit 406 may be configured to cause output signals of a plurality of memory cells to converge at specific values by removing cell-specific variations in the output signals. In some examples, a sense component (not shown) may determine the value of memory cell 404 by comparing the Vout voltage at a node of the AMPCAP 425 with a reference voltage and may latch the value.

Detailed operations of the circuit 400 are further illustrated and described with reference to FIGS. 5A and 5B.

Figure 5A:
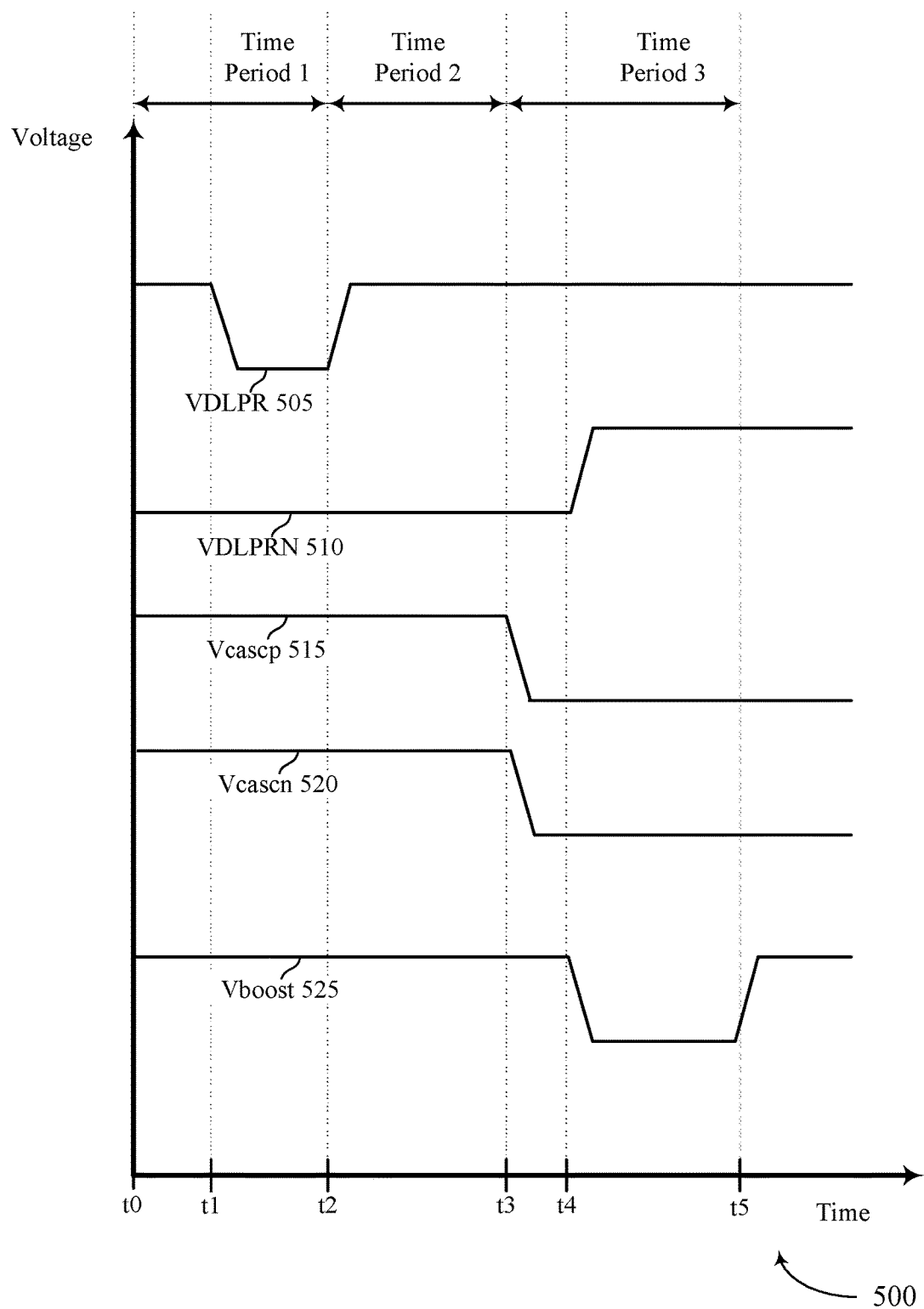
FIGS. 5A and 5B illustrate examples of timing diagrams that support techniques and devices for canceling memory cell variations in accordance with embodiments of the present disclosure.
Figure 5B:
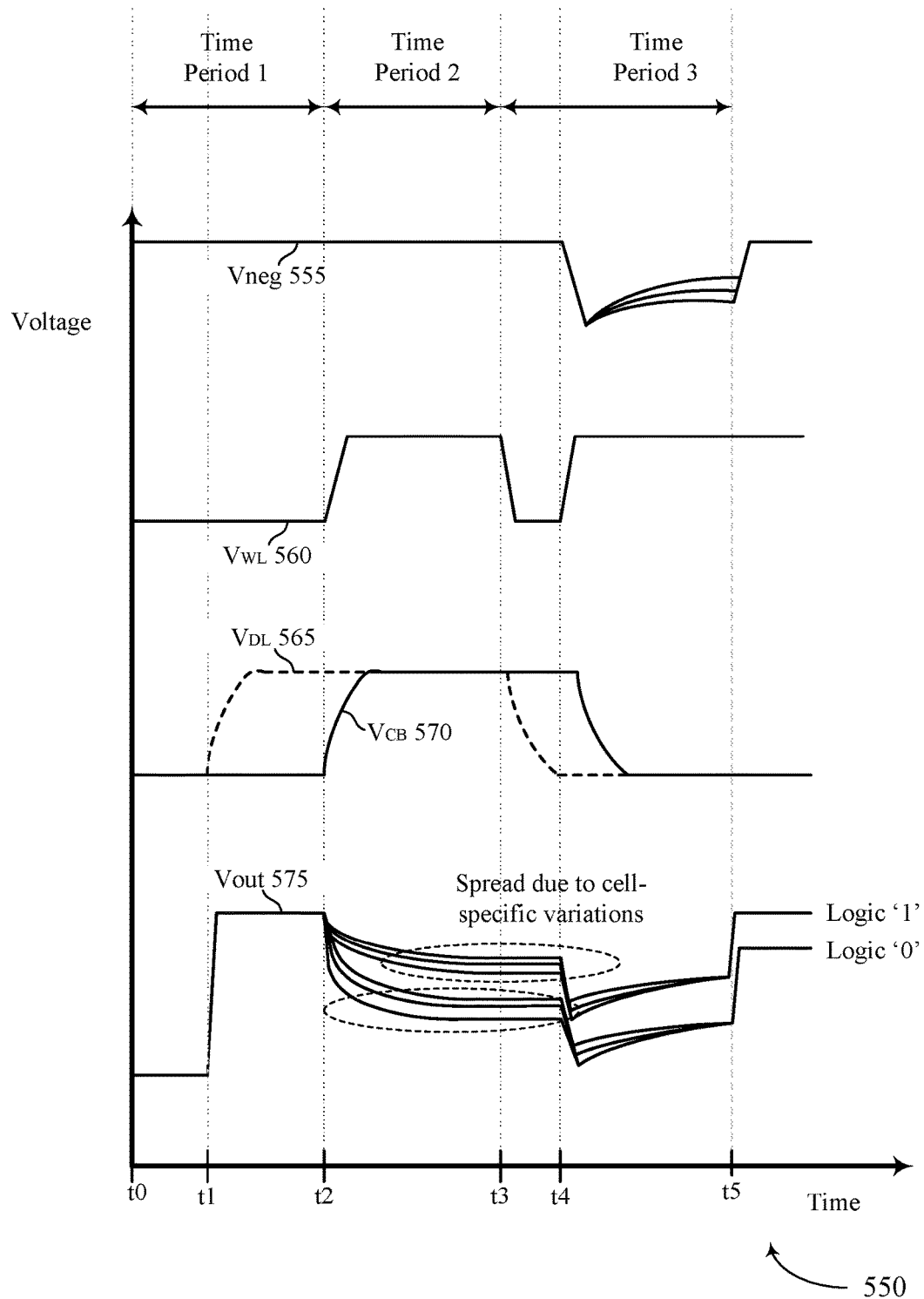
Figure 6:
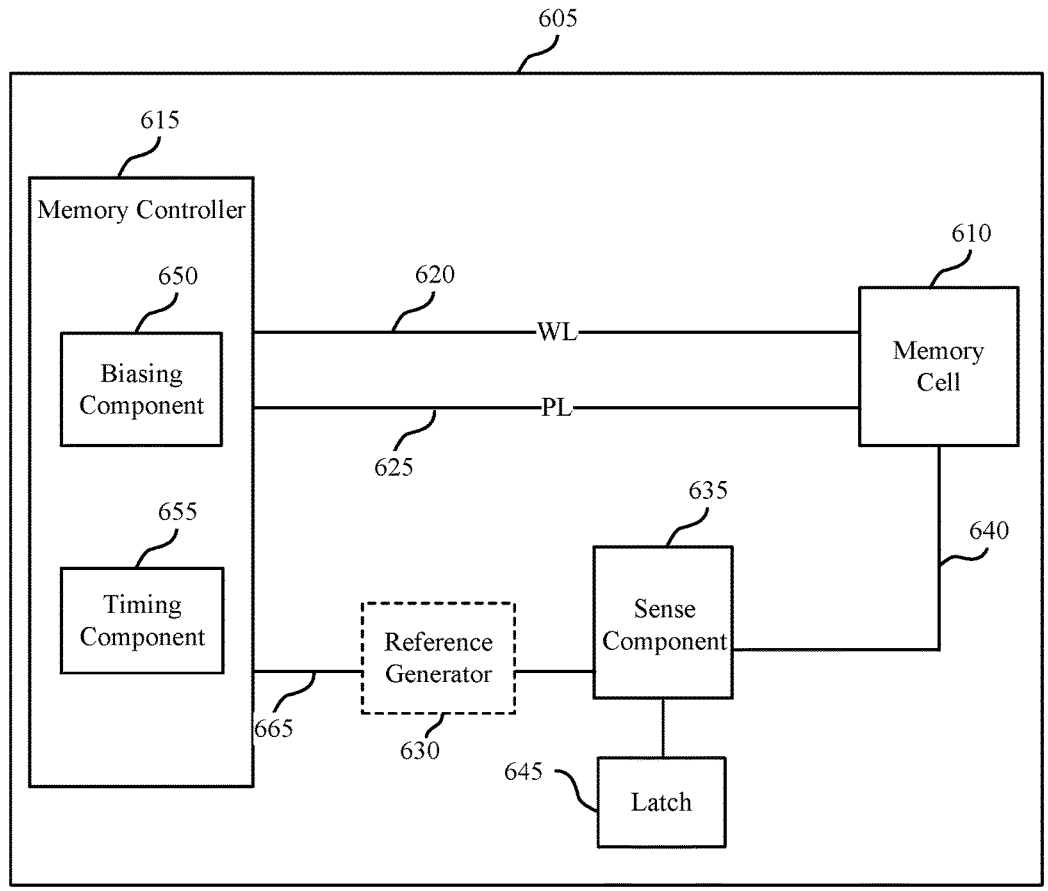
FIGS. 6 through 7 show block diagrams of a device that supports techniques and devices for canceling memory cell variations in accordance with embodiments of the present disclosure.
Figure 7:
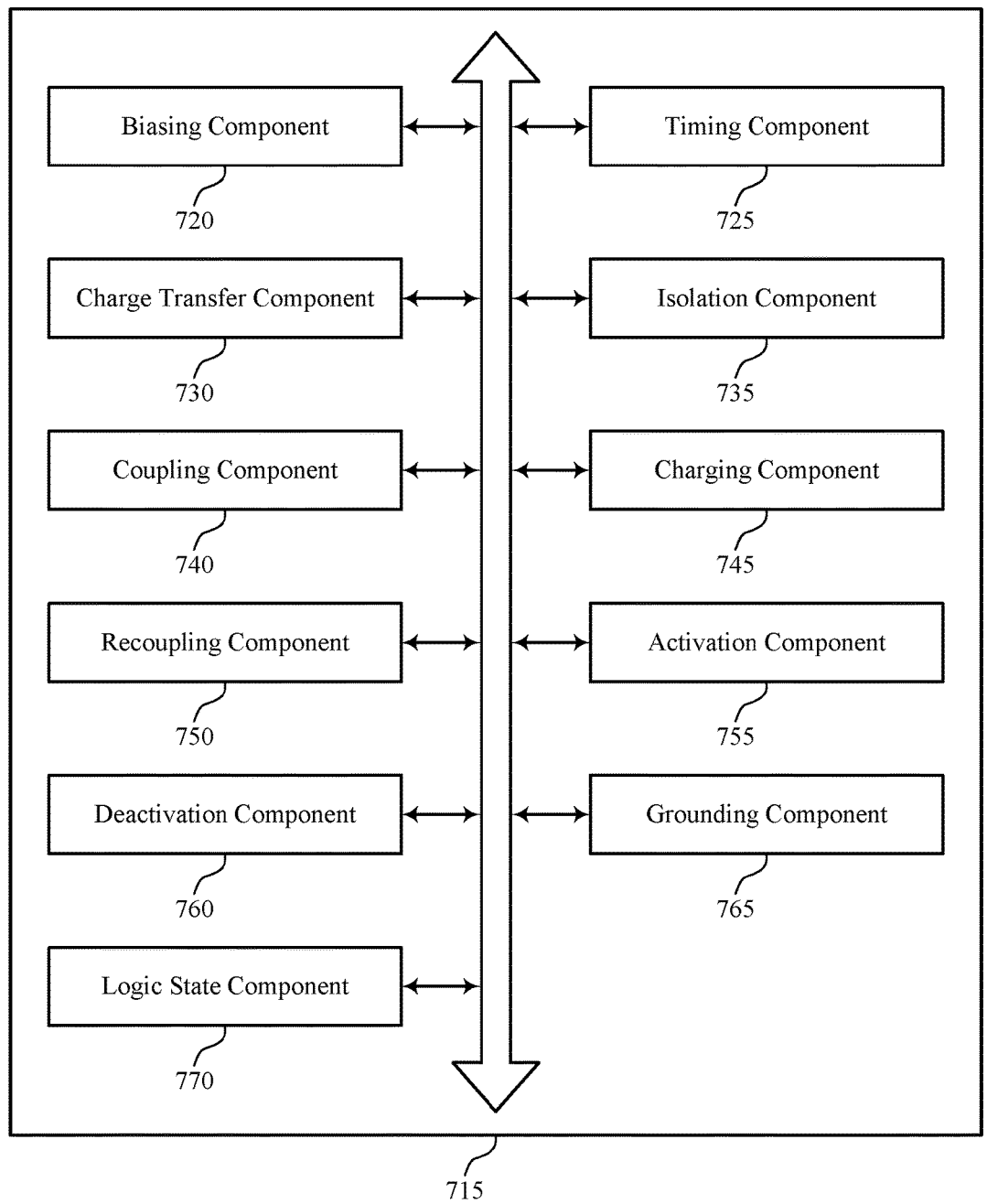
Figure 8:
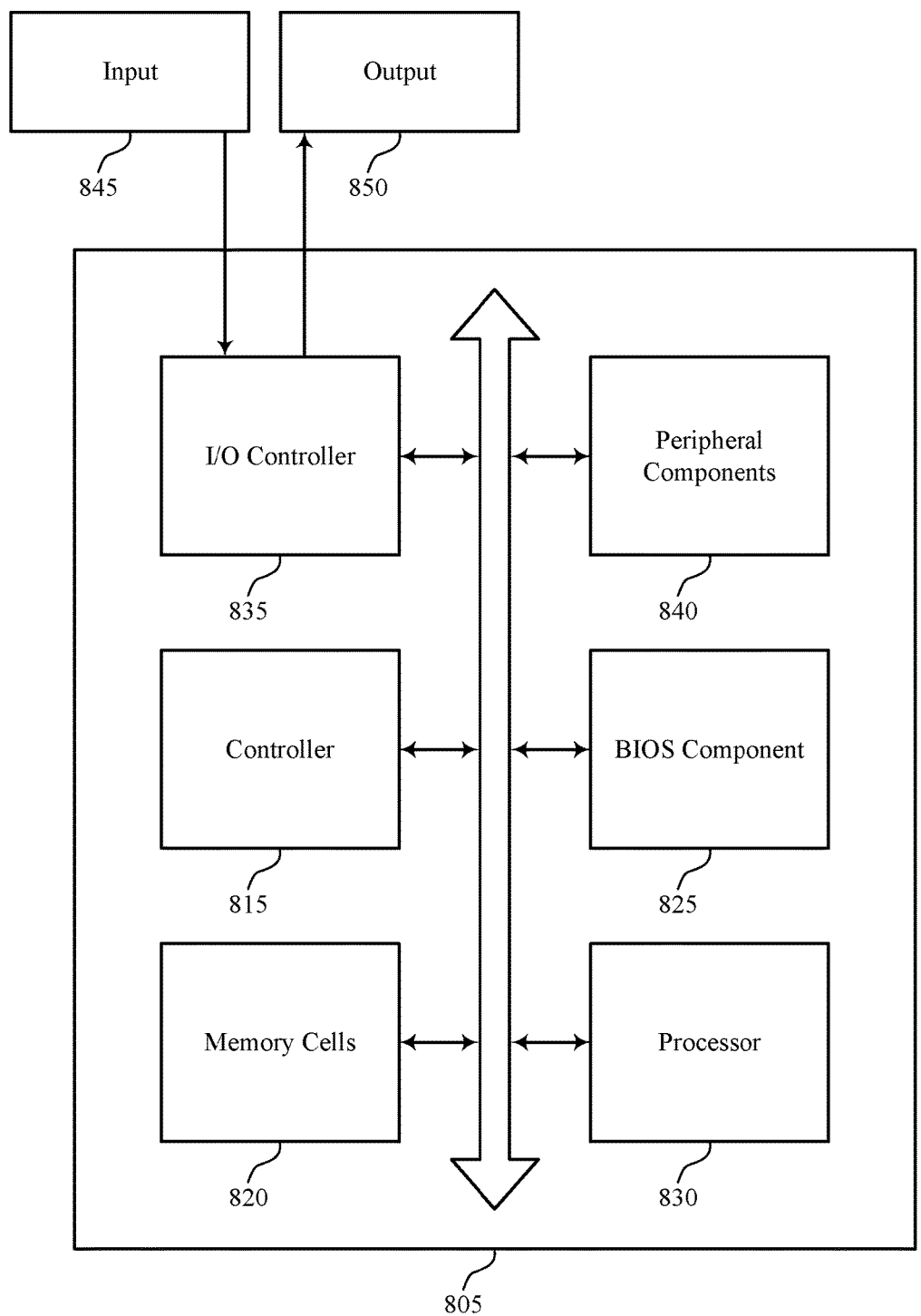
FIG. 8 illustrates a block diagram of a system including a controller that supports techniques and devices for canceling memory cell variations in accordance with embodiments of the present disclosure.
Figure 9:
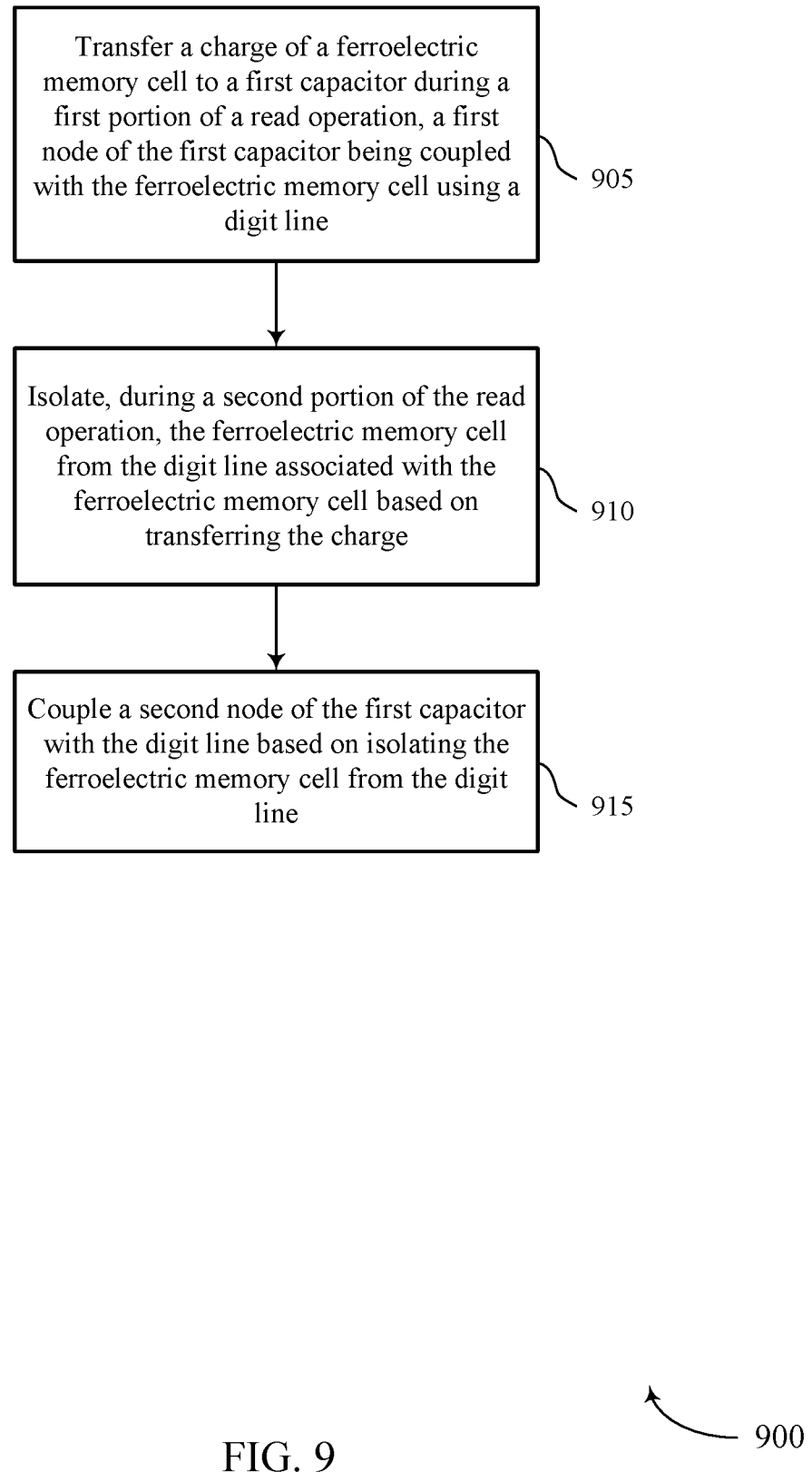
FIGS. 9 through 10 illustrate methods for techniques and devices for canceling memory cell variations in accordance with embodiments of the present disclosure.

FIGS. 5A and 5B illustrate examples of timing diagrams 500 and 550 that supports techniques and devices for canceling memory cell variations in accordance with embodiments of the present disclosure. The timing diagrams 500 and 550 illustrate various signals of the circuit 400 during a read operation. The read operation may include three time periods, Time Period 1, Time Period 2, and Time Period 3. The timing diagrams 500 and 550 show various voltage levels associated with the components of the circuit 400 described with reference to FIG. 4 to illustrate how the techniques for canceling memory cell variations provide a reliable output voltage after a read operation.

As depicted in the example of FIG. 5A and as described with reference to FIG. 4, the timing diagram 500 includes a voltage $V_{DLPR}$ 505, a voltage $V_{DLPRN}$ 510, a voltage Vcascp 515, a voltage Vcascn 520, and a voltage Vboost 525. The voltage $V_{DLPR}$ 505 (corresponding to the $V_{DLPR}$ 410 described with reference to FIG. 4) may be applied to the gate node of the selector device 405 that may activate the selector device 405 to couple the memory cell 404 with a voltage source 402 (such as Vprecharge). The voltage $V_{DLPRN}$ 510 (corresponding to the $V_{DLPRN}$ 442 described with reference to FIG. 4) may be applied to the gate node of the selector device 440 that may activate the selector device 440 to couple the boost capacitor 450 and the AMPCAP 425 with a ground 435.

The voltage Vcascp 515 (corresponding to the voltage Vcascp 475 described with reference to FIG. 4) may be applied to the gate node of the selector device 470 that may activate the selector device 470 to couple the memory cell 404 with the voltage source 402 (e.g., Vprecharge). The voltage Vcascn 520 (corresponding to the voltage Vcascn 465 described with reference to FIG. 4) may be applied to the gate node of the selector device 460 that may activate the selector device 460 to couple the DL 401 with the boost capacitor 450 and the AMPCAP 425. The voltage Vboost 525 (corresponding to the voltage Vboost 455 described with reference to FIG. 4) may be applied to a node of the boost capacitor 450.

Further, as depicted in the example of FIG. 5B and as described with reference to FIG. 4, the timing diagram 550 includes a voltage Vneg 555, a voltage $V_{WL}$ 560, a voltage $V_{DL}$ 565, a voltage $V_{CB}$ 570, and a voltage Vout 575. The voltage Vneg 555 (corresponding to the voltage Vneg 555 applied to the node 430 described with reference to FIG. 4) may be measured at node 430 of the AMPCAP 425. The voltage $V_{WL}$ 560 (corresponding to the voltage applied to WL 485 described with reference to FIG. 4) may be applied to the gate node of the selector device 490 that may activate the selector device 490 to couple the memory cell 404 with the WL 485.

The voltage $V_{DL}$ 565 (corresponding to the voltage calculated at a node of the selector device 490 described with reference to FIG. 4) may be corresponding a voltage of the DL 401 calculated at the drain node of the selector device 490. The voltage $V_{CB}$ 570 (corresponding to the voltage calculated at a node of the selector device 490 described with reference to FIG. 4) may be calculated at the gate node of the selector device 490. The voltage Vout 575 may correspond to the voltage calculated at the node 415 of the AMPCAP 425 described with reference to FIG. 4.

Because, the timing diagrams 500, 550 illustrate a single read operation and are separated only to depict the timings more clearly, signals in either FIG. 5A or FIG. 5B may be described without referencing whether FIG. 5A or FIG. 5B is being discussed. As such, the description herein may bounce between FIGS. 5A and 5B without explicitly stating as much.

During an initial time period (e.g., Time Period 1), a circuit 400 may be precharged. At time t0, the various signals and voltages of the circuit 400 may be set at predetermined levels prior to a read operation commencing. For example, the voltage $V_{WL}$ 560 may initially be biased to a low voltage to deactivate the selector device 490, thereby isolating the memory cell 404 from the DL 401. At time t0, the voltage $V_{DL}$ 565 may initially be biased to a low voltage and the voltage $V_{CB}$ 570 may be biased to a low voltage. At time t0, the voltage Vneg 555 measured at node 430 of the AMPCAP 425 may be initially biased to a high voltage. During the Time Period 1 at time t0, the voltage Vout 575 calculated at the node 415 of the AMPCAP 425 may initially be biased to a low voltage during a precharge operation.

At time t1, the precharge process may begin. At time t1, the voltage $V_{DLPR}$ 505 may be biased to a lower voltage, thereby activating the selector device 405. Upon being activated, the selector device 405 may couple the node 415 of the AMPCAP 425 with a voltage source 402 for the precharge operation. In some cases, the AMPCAP 425 may be precharged to Vprecharge during Time Period 1. As such, the voltage Vout 575 may be biased to a high voltage based on the coupling the node 415 to the voltage source 402.

During the Time Period 1, the voltage Vcascp 515 may be biased to a high voltage level, thereby causing the selector device 470 to be activated. When activated, the selector device 470 may couple the DL 401 with the voltage source 402, thereby precharging the DL 401. The voltage $V_{DL}$ 565 may be biased to a higher voltage (e.g., a precharge voltage) as part of a precharge operation. For example, the voltage $V_{DL}$ 565 corresponding a voltage of the DL 401 may be biased to a higher voltage level based at least in part on the DL 401 being coupled with the voltage source 402. This coupling may occur because both selector device 405 and selector device 470 are activated. This may indicate that the DL 401 is not selected during a first portion of Time Period 1 and then selected during a second portion of Time Period 1.

Also during the Time Period 1, the second node 420 of the AMPCAP 425 may be coupled with the boost capacitor 450 and ground 435. The voltage $V_{DLPRN}$ 510 may be biased to a low voltage thereby activating the selector device 440. When activated, the selector device 440 may couple the second node 430 of the AMPCAP 425 to the voltage source 435 (e.g., $V_{SS}$). The voltage Vboost 525 may be biased to a high voltage thereby applying a voltage difference across boost capacitor 450. The voltage Vneg 555 may be based on the voltage Vboost 525 being high and ground 435 being coupled with the second node 430 of the AMPCAP 425.

At time t2, Time Period 2 may begin. During Time Period 2, the memory cell 404 may transfer its charge to the AMPCAP 425 to be read by the sense component 125. Cell-specific variations caused by the memory cell 404 may cause the resulting charge stored on the AMPCAP 425 to be different than what is expected by the memory controller and/or the reference signal. Such cell specific variations may cause the errors to be introduced into the write operation. For example, the memory controller may interpret the memory cell 404 as storing a logic '1,' when in fact the memory cell 404 stored a logic '0.'

At time t2, the precharge operation may end by the voltage source 402 being isolated from the node 415 and the DL 401. To isolate the voltage source 402 from the other components of the circuit 400, the voltage $V_{DLPR}$ 505 may be biased to a high voltage. Upon receiving a high voltage at the gate node of the selector device 405, the selector device 405 may be deactivated and may isolate the voltage source 402 (Vprecharge) from the other components of the circuit 400.

Also at time t2, the memory cell 404 may be coupled with the DL 401. To do this, the voltage $V_{WL}$ 560 may be biased to a higher voltage thereby activating the selector device 490. Upon coupling the memory cell 404 with the DL 401, the memory cell may begin transferring charge with the DL 401 and/or the AMPCAP 425. As a result, the voltage $V_{CB}$ 570 may rise to a higher voltage level and the voltage Vout 575 may decrease based on charge being exchanged between the memory cell 404 and the AMPCAP 425 during the read operation. The voltage Vout 575 may settle in it one of two levels based on which logic state is stored on the memory cell 404. Between times t2 and t3, the voltage Vout 575 shows some spreading and some variations. The variations in the voltage Vout 575 signal may represent cell-specific variations that may exist in the signal output by the memory cell 404. For example, a charge associated with a logic '1' of a first memory cell may be different than a charge associated with a logic '1' of a second memory cell. Such variations may introduce errors into a read operation that uses a static reference signal.

At time t3, Time Period 3 may begin. During Time Period 3, the circuit 400 may perform the process of normalizing the signal output by the memory cell 404. During the normalization process, the cancelation circuit 406 may remove or cancel cell-specific variations out of the signal transferred from the memory cell 404 to the AMPCAP 425. The normalization process may remove cell-specific artifacts included in the signal transferred during the Time Period 2.

At time t3, the memory cell 404 may be isolated from DL 401. To perform the isolation, the voltage $V_{WL}$ 560 may be biased to a lower voltage, thereby deactivating the selector device 490. After the memory cell 404 is isolated, the voltage $V_{DL}$ 565 may drop to a lower voltage level.

Also at time t3, the node 415 may be isolated from the DL 401, thereby causing the node 415 to float. To perform the isolation, the voltage Vcascp 515 may biased to a lower voltage level, thereby deactivating the selector device 470.

Also at time t3, the cancelation circuit 406 may be coupled with the DL 401. More specifically, the node 430 may be coupled with the DL 401. The voltage Vcascn 465 may biased to lower voltage level, thereby activating the selector device 460.

In some cases, isolating the memory cell 404 from the DL 401, isolating the node 415 from the DL 401, and coupling the node 430 with the DL 401 may be performed concurrently or nearly concurrently. Once these actions are performed the voltage level of the DL 401 may reduce to a low voltage level.

At time t4, the charge stored on the AMPCAP 425 may be normalized such that cell-specific variations are removed. To accomplish this result, a number of actions may be performed at time t4. At time t4, the memory cell 404 may recoupled with the DL 401 by activating the selector device 490. At time t4, the node 430 may be isolated from ground 435 by deactivating the selector device 440. To do this, the voltage $V_{DLPRN}$ 510 may be raised to a higher voltage level. In some cases, the voltage $V_{DLPRN}$ 510 may be kept biased to a higher voltage level until the data is latched at the sense component. At time t4, the voltage Vboost 455 may be biased to a lower voltage level. In some cases, coupling the memory cell 404 from the DL 401, isolating the node 430 from ground 435, and biasing the voltage Vboost 455 to a lower voltage level may be performed concurrently or nearly concurrently.

After these actions are performed, the voltage Vneg 555 may vary with cell-specific variations based on being coupled with the DL 401. These actions may have the effect of tying the node 430 to the DL 401 in such a way that the voltage Vneg 555 is influenced by the charge on the DL 401 and the memory cell 404. During this period, the voltage Vneg 555 may vary based on the characteristics of the memory cell 404. The voltage Vcb 570 may reduce to a lower voltage level because of these actions.

In addition, after these actions performed, the voltage Vout 575 may drop immediately thereafter, but may still exhibit some cell-specific effects. As the voltage Vneg 555 develops its signal that includes cell-specific variations, the cell-specific artifacts in the charge at voltage Vout 575 may be removed. As such, the voltage Vout 575 may converge on common voltage levels representing a logic '1' or a logic '0' regardless of the cell-specific variations that may have existed previously.

At time t5, node 430 may be recoupled to ground 435, the voltage Vboost 525 may be raised back to the higher voltage level, and the node 430 may be isolated from the DL 401. After doing this, the voltage Vneg 555 jumps back up to a higher voltage level, and the voltage Vout 575 may jump up to a higher voltage level. The voltage Vout 575 is depicted to show a first voltage level representing a logic '1' and a second voltage level representing a logic '0' stored by the memory cell 404. The two voltage levels may have had cell-specific variations removed from the signals using the process described herein. The two voltage levels may be close to or similar to designed voltage levels for the memory array. As such the reference signal may be selected to be between the first voltage level and the second voltage to distinguish between the two logic states. The difference between the first voltage level and the second voltage level of the voltage Vout 575 may be referred to as a sense window, and the reference signal may be configured to be in the middle of the sense window.

After the voltage Vout 575 reaches either the first voltage level or the second voltage level, the sense component may be activated. The sense component may compare the voltage Vout 575 to the reference voltage and determine the logic state stored on the memory cell 404 based on that comparison. These operations may occur sometime after time t5.

FIG. 2 shows a block diagram 200 of a memory array 205 that supports techniques and devices for canceling memory cell variations in accordance with embodiments of the present disclosure. Memory array 205 may be referred to as an electronic memory apparatus, and may be an example of a component of a controller 140 as described herein.

Memory array 205 may include one or more memory cells 210, a memory controller 215, a word line 220, a plate line 225, a reference generator 230, a sense component 235, a digit line 240, and a latch 245. These components may be in electronic communication with each other and may perform one or more of the functions described herein. In some cases, memory controller 215 may include biasing component 250 and timing component 255. In some cases, sense component 235 may serve as the reference generator 630. In other cases, reference generator may be optional.

Memory controller 215 may be in electronic communication with word line 220, digit line 240, sense component 235, and plate line 225, which may be examples of word line 110, digit line 115, sense component 125, and plate line 210 described with reference to FIGS. 1, and 2. Memory array 205 may also include reference generator 630 and a latch 245. The components of memory array 205 may be in electronic communication with each other and may perform aspects of the functions described with reference to FIGS. 1 through 5. In some cases, reference generator 230, sense component 235, and latch 245 may be components of memory controller 215.

In some examples, digit line 240 is in electronic communication with sense component 235 and a ferroelectric capacitor of ferroelectric memory cells 210. A ferroelectric memory cell 210 may be writable with a logic state (e.g., a first or second logic state). Word line 220 may be in electronic communication with memory controller 215 and a selection component of ferroelectric memory cell 210. Plate line 225 may be in electronic communication with memory controller 215 and a plate of the ferroelectric capacitor of ferroelectric memory cell 210. Sense component 235 may be in electronic communication with memory controller 215, digit line 240, latch 245, and reference line 260. reference generator 230 may be in electronic communication with memory controller 215 and reference line 260. Sense control line 265 may be in electronic communication with sense component 235 and memory controller 215. These components may also be in electronic communication with other components, both inside and outside of memory array 205, in addition to components not listed above, via other components, connections, or buses.

Memory controller 215 may be configured to activate word line 220, plate line 225, or digit line 240 by applying voltages to those various nodes. For example, biasing component 250 may be configured to apply a voltage to operate memory cell 210 to read or write memory cell 210 as described above. In some cases, memory controller 215 may include a row decoder, column decoder, or both, as described herein. This may enable memory controller 215 to access one or more memory cells 105. Biasing component 250 may also provide voltage to reference generator 230 to generate a reference signal for sense component 235. Additionally, biasing component 250 may provide voltage for the operation of sense component 235.

In some cases, memory controller 215 may perform its operations using timing component 255. For example, timing component 255 may control the timing of the various word line selections or plate biasing, including timing for switching and voltage application to perform the memory functions, such as reading and writing, discussed herein. In some cases, timing component 255 may control the operations of biasing component 250.

Reference generator 230 may include various components to generate a reference signal for sense component 235. reference generator 230 may include circuitry configured to produce a reference signal. In some cases, reference generator 230 may be implemented using other ferroelectric memory cells 105. Sense component 235 may compare a signal from memory cell 210 (through digit line 240) with a reference signal from reference generator 230. Upon determining the logic state, the sense component may then store the output in latch 245, where it may be used in accordance with the operations of an electronic device that memory array 205 is a part. Sense component 235 may include a sense amplifier in electronic communication with the latch and the ferroelectric memory cell.

Controller 215 may be an example of aspects of the memory controller 140 described with reference to FIG. 1.

Controller 215 and/or at least some of its various subcomponents may be implemented in hardware, software executed by a processor, firmware, or any combination thereof. If implemented in software executed by a processor, the functions of the controller 215 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The controller 215 and/or at least some of its various sub-components may be physically located at various positions, including being distributed such that portions of functions are implemented at different physical locations by one or more physical devices. In some examples, controller 215 and/or at least some of its various sub-components may be a separate and distinct component in accordance with various embodiments of the present disclosure. In other examples, controller 215 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Controller 215 may transfer a charge of a ferroelectric memory cell to a first capacitor during a first portion of a read operation, a first node of the first capacitor being coupled with the ferroelectric memory cell using a digit line, isolate, during a second portion of the read operation, the ferroelectric memory cell from the digit line associated with the ferroelectric memory cell based on transferring the charge, and couple a second node of the first capacitor with the digit line based on isolating the ferroelectric memory cell from the digit line.

FIG. 3 shows a block diagram 300 of a controller 315 that supports techniques and devices for canceling memory cell variations in accordance with embodiments of the present disclosure. The controller 315 may be an example of aspects of a controller 615 described with reference to FIG. 2. The controller 315 may include biasing component 320, timing component 325, charge transfer component 330, isolation component 335, coupling component 340, charging component 345, recoupling component 350, activation component 355, deactivation component 360, grounding component 365, and logic state component 370. Each of these modules may communicate, directly or indirectly, with one another (e.g., via one or more buses).

Biasing component 320 may bias the second node of the first capacitor to a voltage during a period that at least partially overlaps with a period for transferring the charge of the ferroelectric memory cell to the first capacitor based at least in part coupling the second node of the first capacitor with the digit line. In some cases, biasing component 320 may bias the second node of the first capacitor is configured to compensate for variations in the charge transferred to the first capacitor caused by the ferroelectric memory cell. In some examples, biasing component 320 may bias, during a third portion of the read operation after the second portion, a word line of the ferroelectric memory cell to couple the ferroelectric memory cell with the digit line. In some implementations, biasing component 320 may bias, during a third portion of the read operation, a first node of a second capacitor, where a second node of the second capacitor is coupled with the second node of the first capacitor, Charge transfer component 330 may transfer a charge of a ferroelectric memory cell to a first capacitor during a first portion of a read operation, a first node of the first capacitor being coupled with the ferroelectric memory cell using a digit line.

Isolation component 335 may isolate, during a second portion of the read operation, the ferroelectric memory cell from the digit line associated with the ferroelectric memory cell based on transferring the charge. In some cases, isolation component 335 may isolate, during a third portion of the read operation after the second portion, the second node of the first capacitor from a ground of the first capacitor. In some cases, isolating the ferroelectric memory cell from the digit line includes: biasing, during the second portion, a word line of the ferroelectric memory cell to deactivate a switching component that couples the ferroelectric memory cell with the digit line, where the second portion is after the first portion.

Coupling component 340 may couple a second node of the first capacitor with the digit line based on isolating the ferroelectric memory cell from the digit line.

Charging component 345 may charge a second capacitor having a first node coupled with the second node of the first capacitor, where biasing the second node of the first capacitor is based on charging the second capacitor.

Recoupling component 350 may recouple, during a third portion of the read operation after the second portion, the ferroelectric memory cell with the digit line, where biasing the second node of the first capacitor is based on recoupling the ferroelectric memory cell.

Activation component 355 may activate, during the second portion, a switching component that couples the second node of the first capacitor with the digit line and activate, during the first portion, a switching component that couples the second node of the first capacitor with a ground. In some cases, grounding the second node of the first capacitor is based on activating the switching component.

Deactivation component 360 may deactivate, during the second portion, a switching component that couples the digit line with the first node of the first capacitor. Grounding component 365 may ground the second node of the first capacitor during the first portion. Logic state component 370 may determine a logic state after the second portion of the read operation using a charge stored on the first capacitor based on coupling the second node of the first capacitor with the digit line.

FIG. 4 shows a diagram of a system 400 including a device 405 that supports techniques and devices for canceling memory cell variations in accordance with embodiments of the present disclosure. Device 405 may be an example of or include the components of controller 140 as described above, e.g., with reference to FIG. 1. Device 405 may include components for bi-directional voice and data communications including components for transmitting and receiving communications, including controller 415, memory cells 420, basic input/output system (BIOS) component 425, processor 430, I/O controller 435, and peripheral components 440. These components may be in electronic communication via one or more buses (e.g., bus 410).

Memory cells 420 may store information (i.e., in the form of a logical state) as described herein.

BIOS component 425 be a software component that includes BIOS operated as firmware, which may initialize and run various hardware components. BIOS component 425 may also manage data flow between a processor and various other components, e.g., peripheral components, input/output control component, etc. BIOS component 425 may include a program or software stored in read only memory (ROM), flash memory, or any other non-volatile memory.

Processor 430 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 430 may be configured to operate a memory array using a memory controller. In other cases, a memory controller may be integrated into processor 430. Processor 430 may be configured to execute computer-readable instructions stored in a memory to perform various functions (e.g., functions or tasks supporting Techniques and devices for canceling memory cell variations).

I/O controller 435 may manage input and output signals for device 405. I/O controller 435 may also manage peripherals not integrated into device 405. In some cases, I/O controller 435 may represent a physical connection or port to an external peripheral. In some cases, I/O controller 435 may utilize an operating system such as iOS®, ANDROID®, MS-DOS®, MS-WINDOWS®, OS/2®, UNIX®, LINUX®, or another known operating system. In other cases, I/O controller 435 may represent or interact with a modem, a keyboard, a mouse, a touchscreen, or a similar device. In some cases, I/O controller 435 may be implemented as part of a processor. In some cases, a user may interact with device 405 via I/O controller 435 or via hardware components controlled by I/O controller 435.

Peripheral components 440 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 445 may represent a device or signal external to device 405 that provides input to device 405 or its components. This may include a user interface or an interface with or between other devices. In some cases, input 445 may be managed by I/O controller 435, and may interact with device 405 via a peripheral component 440.

Output 450 may also represent a device or signal external to device 405 configured to receive output from device 405 or any of its components. Examples of output 450 may include a display, audio speakers, a printing device, another processor or printed circuit board, etc. In some cases, output 450 may be a peripheral element that interfaces with device 405 via peripheral component(s) 440. In some cases, output 450 may be managed by I/O controller 435

The components of device 405 may include circuitry designed to carry out their functions. This may include various circuit elements, for example, conductive lines, transistors, capacitors, inductors, resistors, amplifiers, or other active or inactive elements, configured to carry out the functions described herein. Device 405 may be a computer, a server, a laptop computer, a notebook computer, a tablet computer, a mobile phone, a wearable electronic device, a personal electronic device, or the like. Or device 405 may be a portion or aspect of such a device.

FIG. 5 shows a flowchart illustrating a method 500 for techniques and devices for canceling memory cell variations in accordance with embodiments of the present disclosure. The operations of method 500 may be implemented by a controller 615 or its components as described herein. For example, the operations of method 500 may be performed by a controller as described with reference to FIGS. 2 through 4. In some examples, a controller 615 may execute a set of codes to control the functional elements of the device to perform the functions described below. Additionally or alternatively, the controller 615 may perform aspects of the functions described below using special-purpose hardware.

At 505, a controller may transfer a charge of a ferroelectric memory cell to a first capacitor during a first portion of a read operation, a first node of the first capacitor being coupled with the ferroelectric memory cell using a digit line. The operations of 505 may be performed according to the methods described herein. In certain examples, aspects of the operations of 505 may be performed by a charge transfer component as described with reference to FIGS. 2 through 4.

At 510, the controller may isolate, during a second portion of the read operation, the ferroelectric memory cell from the digit line associated with the ferroelectric memory cell based at least in part on transferring the charge. The operations of 510 may be performed according to the methods described herein. In certain examples, aspects of the operations of 510 may be performed by an isolation component as described with reference to FIGS. 2 through 4.

At 515 the controller may couple a second node of the first capacitor with the digit line based at least in part on isolating the ferroelectric memory cell from the digit line. The operations of 515 may be performed according to the methods described herein. In certain examples, aspects of the operations of 515 may be performed by a coupling component as described with reference to FIGS. 2 through 8.

An apparatus for performing the method 900 is described. The apparatus may include means for transferring a charge of a ferroelectric memory cell to a first capacitor during a first portion of a read operation, a first node of the first capacitor being coupled with the ferroelectric memory cell using a digit line, means for isolating, during a second portion of the read operation, the ferroelectric memory cell from the digit line associated with the ferroelectric memory cell based at least in part on transferring the charge, and means for coupling a second node of the first capacitor with the digit line based at least in part on isolating the ferroelectric memory cell from the digit line.

Some examples of the method and apparatus described above may further include processes, features, means, or instructions for biasing the second node of the first capacitor to a voltage during a period that at least partially overlaps with a period for transferring the charge of the ferroelectric memory cell to the first capacitor based at least in part coupling the second node of the first capacitor with the digit line.

Some examples of the method and apparatus described above may further include processes, features, means, or instructions for biasing the second node of the first capacitor may be configured to compensate for variations in the charge transferred to the first capacitor caused by the ferroelectric memory cell.

Some examples of the method and apparatus described above may further include processes, features, means, or instructions for charging a second capacitor having a first node coupled with the second node of the first capacitor, wherein biasing the second node of the first capacitor may be based at least in part on charging the second capacitor.

Some examples of the method and apparatus described above may further include processes, features, means, or instructions for recoupling, during a third portion of the read operation after the second portion, the ferroelectric memory cell with the digit line, wherein biasing the second node of the first capacitor may be based at least in part on recoupling the ferroelectric memory cell.

Some examples of the method and apparatus described above may further include processes, features, means, or instructions for activating, during the second portion, a switching component that couples the second node of the first capacitor with the digit line.

In some examples of the method and apparatus described above, isolating the ferroelectric memory cell from the digit line comprises: biasing, during the second portion, a word line of the ferroelectric memory cell to deactivate a switching component that couples the ferroelectric memory cell with the digit line, wherein the second portion may be after the first portion.

Some examples of the method and apparatus described above may further include processes, features, means, or instructions for deactivating, during the second portion, a switching component that couples the digit line with the first node of the first capacitor.

Some examples of the method and apparatus described above may further include processes, features, means, or instructions for biasing, during a third portion of the read operation after the second portion, a word line of the ferroelectric memory cell to couple the ferroelectric memory cell with the digit line.

Some examples of the method and apparatus described above may further include processes, features, means, or instructions for grounding the second node of the first capacitor during the first portion.

Some examples of the method and apparatus described above may further include processes, features, means, or instructions for activating, during the first portion, a switching component that couples the second node of the first capacitor with a ground, wherein grounding the second node of the first capacitor may be based at least in part on activating the switching component.

Some examples of the method and apparatus described above may further include processes, features, means, or instructions for isolating, during a third portion of the read operation after the second portion, the second node of the first capacitor from a ground of the first capacitor.

Some examples of the method and apparatus described above may further include processes, features, means, or instructions for biasing, during a third portion of the read operation, a first node of a second capacitor, wherein a second node of the second capacitor may be coupled with the second node of the first capacitor.

Some examples of the method and apparatus described above may further include processes, features, means, or instructions for determining a logic state after the second portion of the read operation using a charge stored on the first capacitor based at least in part on coupling the second node of the first capacitor with the digit line.

Figure 10:
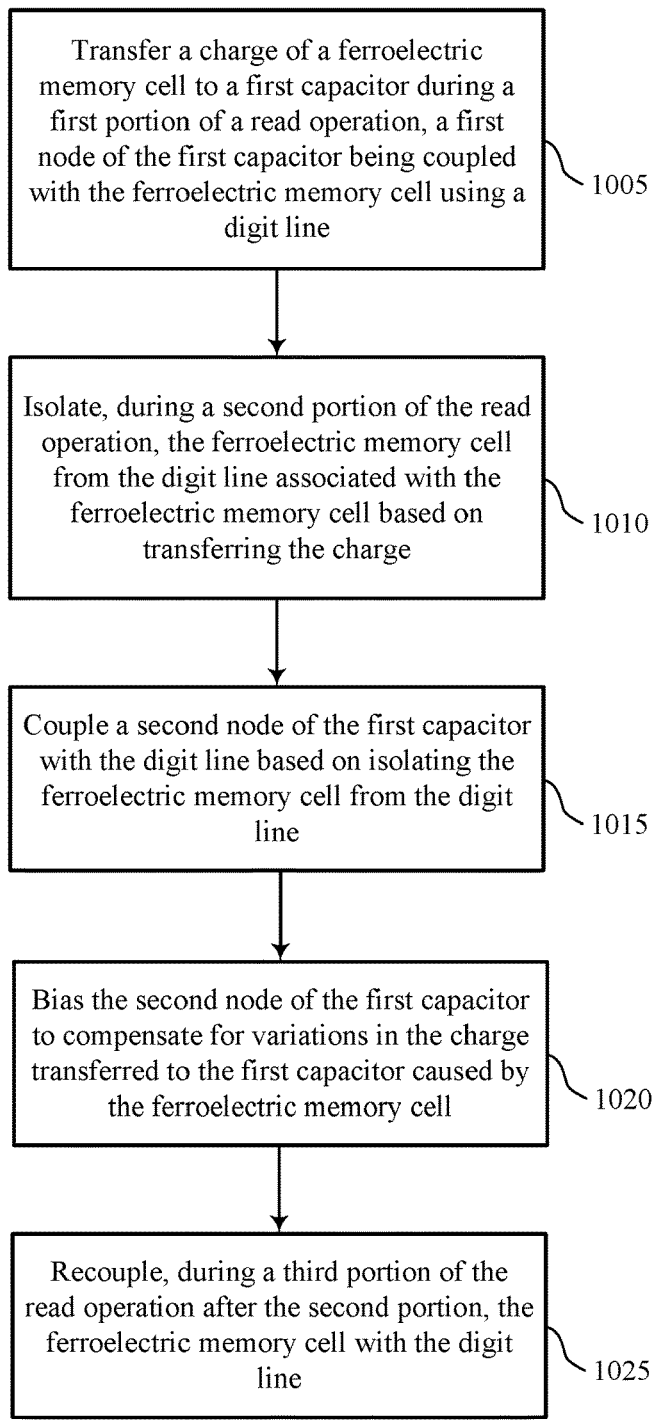

FIG. 10 shows a flowchart illustrating a method 1000 for techniques and devices for canceling memory cell variations in accordance with embodiments of the present disclosure. The operations of method 1000 may be implemented by a controller 615 or its components as described herein. For example, the operations of method 1000 may be performed by a controller as described with reference to FIGS. 2 through 4. In some examples, a controller 615 may execute a set of codes to control the functional elements of the device to perform the functions described below. Additionally or alternatively, the controller 615 may perform aspects of the functions described below using special-purpose hardware.

At 1005, a controller may transfer a charge of a ferroelectric memory cell to a first capacitor during a first portion of a read operation, a first node of the first capacitor being coupled with the ferroelectric memory cell using a digit line. The operations of 1005 may be performed according to the methods described herein. In certain examples, aspects of the operations of 1005 may be performed by a charge transfer component as described with reference to FIGS. 2 through 4.

At 1010, the controller may isolate, during a second portion of the read operation, the ferroelectric memory cell from the digit line associated with the ferroelectric memory cell based at least in part on transferring the charge. The operations of 1010 may be performed according to the methods described herein. In certain examples, aspects of the operations of 1010 may be performed by an isolation component as described with reference to FIGS. 2 through 4.

At 1015 the controller may couple a second node of the first capacitor with the digit line based at least in part on isolating the ferroelectric memory cell from the digit line. The operations of 1015 may be performed according to the methods described herein. In certain examples, aspects of the operations of 1015 may be performed by a coupling component as described with reference to FIGS. 2 through 8.

At 1020 the controller may bias the second node of the first capacitor to compensate for variations in the charge transferred to the first capacitor caused by the ferroelectric memory cell. In some cases, the biasing of the second node of the first capacitor to a voltage may be during a period that at least partially overlaps with a period for transferring the charge of the ferroelectric memory cell to the first capacitor. The operations of 1020 may be performed according to the methods described herein. In certain examples, aspects of the operations of 1020 may be performed by a biasing component as described with reference to FIGS. 2 through 8.

At 1025 the controller may recouple, during a third portion of the read operation after the second portion, the ferroelectric memory cell with the digit line. The operations of 1025 may be performed according to the methods described herein. In certain examples, aspects of the operations of 1025 may be performed by a recoupling component as described with reference to FIGS. 2 through 8.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three-terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
transferring a charge of a ferroelectric memory cell to a first capacitor during a first portion of a read operation, a first node of the first capacitor being coupled with the ferroelectric memory cell using a digit line;
isolating, during a second portion of the read operation, the ferroelectric memory cell from the digit line associated with the ferroelectric memory cell based at least in part on transferring the charge, wherein isolating the ferroelectric memory cell comprises biasing, during the second portion, a word line of the ferroelectric memory cell to deactivate a switching component that couples the ferroelectric memory cell with the digit line, wherein the second portion is after the first portion; and
coupling a second node of the first capacitor with the digit line based at least in part on isolating the ferroelectric memory cell from the digit line.

2. The method of claim 1, further comprising:
biasing the second node of the first capacitor to a voltage during a period that at least partially overlaps with a period for transferring the charge of the ferroelectric memory cell to the first capacitor based at least in part coupling the second node of the first capacitor with the digit line.

3. The method of claim 2, wherein biasing the second node of the first capacitor is configured to compensate for variations in the charge transferred to the first capacitor caused by the ferroelectric memory cell.

4. The method of claim 2, further comprising:
charging a second capacitor having a first node coupled with the second node of the first capacitor, wherein biasing the second node of the first capacitor is based at least in part on charging the second capacitor.

5. The method of claim 2, further comprising:
recoupling, during a third portion of the read operation after the second portion, the ferroelectric memory cell with the digit line, wherein biasing the second node of the first capacitor is based at least in part on recoupling the ferroelectric memory cell.

6. The method of claim 1, further comprising:
activating, during the second portion, the switching component that couples the second node of the first capacitor with the digit line.

7. The method of claim 1, further comprising:
deactivating, during the second portion, the switching component that couples the digit line with the first node of the first capacitor.

8. The method of claim 1, further comprising:
biasing, during a third portion of the read operation after the second portion, the word line of the ferroelectric memory cell to couple the ferroelectric memory cell with the digit line.

9. The method of claim 1, further comprising:
grounding the second node of the first capacitor during the first portion.

10. The method of claim 9, further comprising:
activating, during the first portion, the switching component that couples the second node of the first capacitor with a ground, wherein grounding the second node of the first capacitor is based at least in part on activating the switching component.

11. The method of claim 1, further comprising:
isolating, during a third portion of the read operation after the second portion, the second node of the first capacitor from a ground.

12. The method of claim 1, further comprising:
biasing, during a third portion of the read operation, a first node of a second capacitor, wherein a second node of the second capacitor is coupled with the second node of the first capacitor.

13. The method of claim 1, further comprising:
determining a logic state after the second portion of the read operation using a charge stored on the first capacitor based at least in part on coupling the second node of the first capacitor with the digit line.

* * * * *